United States Patent [19]
Higgins, III

[11] Patent Number: 5,583,377
[45] Date of Patent: Dec. 10, 1996

[54] PAD ARRAY SEMICONDUCTOR DEVICE HAVING A HEAT SINK WITH DIE RECEIVING CAVITY

[75] Inventor: Leo M. Higgins, III, Austin, Tex.

[73] Assignee: Motorola, Inc., Schaumburg, Ill.

[21] Appl. No.: 537,169

[22] Filed: Sep. 29, 1995

Related U.S. Application Data

[63] Continuation of Ser. No. 913,319, Jul. 15, 1992, abandoned.

[51] Int. Cl.⁶ .......................... H01L 23/10; H01L 23/34; H05K 7/20
[52] U.S. Cl. .......................... 257/707; 257/706; 257/713; 257/722; 361/707; 361/712; 361/714
[58] Field of Search .................... 257/712, 713, 257/717, 718, 719, 697, 698, 675, 659, 706, 707, 720, 773, 775; 361/688, 697, 702, 704, 707, 709, 712, 714

[56] References Cited

U.S. PATENT DOCUMENTS

| | | | |
|---|---|---|---|
| 3,399,332 | 8/1968 | Savolainen | 317/234 |
| 4,737,395 | 4/1988 | Mabuchi et al. | 428/138 |
| 4,829,403 | 5/1989 | Harding | 257/713 |
| 4,835,598 | 5/1989 | Higuchi et al. | 257/659 |
| 4,890,152 | 12/1989 | Hirata et al. | 357/72 |
| 5,045,921 | 9/1991 | Lin et al. | 257/698 |
| 5,233,225 | 8/1993 | Ishida et al. | 257/773 |

*Primary Examiner*—Carl Whitehead, Jr.
*Attorney, Agent, or Firm*—Patricia S. Goddard

[57] ABSTRACT

A semiconductor device (10) provides heat dissipation while maintaining a low profile. The device includes a circuitized substrate (12) having an opening (20). Inserted into, or at least covering, the opening is a heat sink (22) having a base portion (24), sidewalls (26), and flanges (28). Flanges of the heat sink are attached or supported by a surface of the substrate. Together the base portion and sidewalls of the heat sink form a cavity for receiving a semiconductor die (13). The die is electrically coupled to conductive traces (14) formed on the substrate by wire bonds (19), and the traces are electrically coupled to solder balls (21) by conductive vias (18). In one embodiment, base portion (24) of heat sink (22) extends below substrate (12) to permit contact to a user substrate (34). While in another embodiment, a base portion (118) of a heat sink (116) is exposed on a top surface of a substrate (112) for coupling to another heat sink (124).

13 Claims, 3 Drawing Sheets

5,583,377

PAD ARRAY SEMICONDUCTOR DEVICE HAVING A HEAT SINK WITH DIE RECEIVING CAVITY

This application is a continuation of prior application Ser. No. 07/913,319, filed on Jul. 15, 1992, now abandoned.

Cross-Reference to Related Application

The present application is related to a commonly assigned co-pending application by John R. Pastore et al. entitled, "Pad Array Semiconductor Device With Thermal Conductor and Process for Making the Same," Attorney Docket No. SC-01372A, Ser. No. 07/913,312 filed Jul. 15, 1992, now U.S. Pat. No. 5,285,352.

FIELD OF THE INVENTION

The present invention relates to semiconductor devices in general, and more specifically to pad array semiconductor devices having heat sinks and methods for making the same.

BACKGROUND OF THE INVENTION

Heat dissipation requirements are very important in semiconductor devices, particularly as the power and the performance of devices increases. At the same time, it is important that each device be kept as small as possible. Yet achieving both desirable heat dissipation and maintaining a small device size is quite difficult. Conventional heat removal methods typically increase device size and mass considerably. Maximum heat removal is achieved by exposing the largest surface area of a heat sink possible; therefore, rather large heat sinks are commonly used.

One known method of removing heat from a semiconductor device without substantial increase in device size is the use of thermal vias. Thermal vias, for example, are used in pad array or pin grid array semiconductor devices which employ printed circuit board (PCB) substrates as part of the device package. In these devices, a semiconductor die is mounted on the PCB and is electrically coupled, for instance by wire bonds, to a pattern of conductive traces formed on the top of the PCB. Each conductive trace is routed to a corresponding trace or pad in the bottom of the PCB by a conductive via which extends through the PCB. These conductive vias are often referred to as plated through-holes. In addition to the vias which electrically couple one trace to another, "dummy" vias which are not used for electrical connection may also be included in the PCB. Typically, the dummy vias are positioned directly beneath a semiconductor die and are plated or filled with a thermally conductive material such as copper, gold, or solder. The sole purpose of the dummy vias is to dissipate heat away from the semiconductor die and into thermally conductive planes of the PCB, a heat sink, or an underlying substrate. Thus, these vias are also referred to as thermal vias.

Although the use of thermal vias can avoid the need to employ bulky heat sinks, the heat dissipation in thermal vias is significantly limited. The amount of heat which a thermal via can transfer is related to the cross-sectional area of the via. Typically, thermal vias have the same dimensions as conventional signal carrying vias, for instance 0.3 mm in diameter with a plating thickness of 0.02 mm. Thus, a thermal via has a conductive cross-sectional area of only 0.02 mm$^2$. Thermal resistance through the via can be minimized by making the thermally conducting cross-sectional area of the via as large as possible. One method of achieving a larger cross-sectional area is by increasing the plating thickness in the thermal vias; however, beyond a certain plating thickness, the plating operation is difficult to control repeatedly. Another way to increase the effective cross-sectional area is by adding more thermal vias. But adding more vias undesirably increases the size of the device and reduces the availability of signal routing in and around the thermal vias.

SUMMARY OF THE INVENTION

Many of the problems addressed above are overcome by the present invention. In one form, a semiconductor device has a circuitized substrate. The substrate has a first surface, an opposing second surface, a plurality of traces formed on one of the first and second surfaces. The substrate also has an opening which extends completely through the substrate. The device also has a heat sink having a base portion, sidewalls, a die receiving cavity, and flanges which extend outward from the sidewalls. The flanges of the heat sink are attached adjacent one of the first and second surfaces of the substrate such that the opening of the substrate is at least partially closed. A semiconductor die is positioned in the die receiving cavity of the heat sink. Means for electrically coupling the die to the conductive traces is also provided in the device, as is a means for encapsulating the die and the opening in the substrate. A plurality of terminals is attached to one of the first and second surfaces of the substrate. The terminals are also electrically coupled to the conductive traces to provide external electrical access to the die.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

With the present invention, heat dissipation is improved in a semiconductor device in comparison to devices which employ thermal vias. Furthermore, improvement in heat dissipation is achieved without substantial increase a device mass. In accordance with one form of the present invention, a circuitized substrate in used in a pad array semiconductor device. The substrate includes an opening that extends completely through the substrate. A heat sink is inserted in the opening, or otherwise attached to the substrate to at least partially close the opening. The heat sink includes a base portion, sidewalls extending from the base portion, and flanges extending outwardly from the sidewalls. Together the base and sidewalls form a cavity for receiving a semiconductor die. The heat sink is secured in or around the opening of the substrate by the flanges. The base portion of the heat sink is exposed on one of the surfaces of the substrate, and preferably extends far enough below the circuitized substrate to be thermally coupled to a user's substrate. A semiconductor die is mounted in the die receiving cavity of the heat sink and is electrically coupled to conductive traces of the circuitized substrate by wire bonds or the like. The die and portions of the substrate are encapsulated, for instance, by an epoxy resin for protection. Terminals, such as solder balls or conductive pins, are attached to the substrate and electrically coupled to the conductive traces to provide external electrical connection to the semiconductor die.

Figure 1:
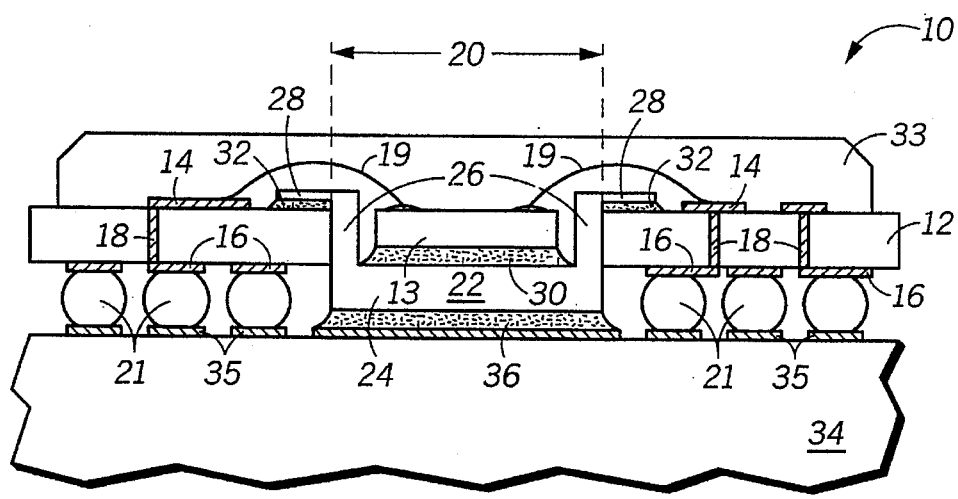
FIGS. 1–3 each illustrate, in cross-section, a semiconductor device in accordance with the present invention.

FIG. 1 illustrates a cross-sectional view of a semiconductor device 10 in accordance with the present invention. Device 10 includes a circuitized substrate 12. Substrate 12 is called a circuitized substrate because it is used for routing electrical signals to and from a semiconductor die 13. To accomplish signal routing, substrate 12 includes a plurality of conductive traces 14 on its top surface. In most instances, conductive traces will also be on a bottom surface the substrate (although not fully illustrated in FIG. 1). Traces on the bottom of substrate 12 each terminate with a conductive pad 16. Conductive traces on the top and bottom of the substrate are electrically coupled together, most often in a one-to-one correspondence, by a plurality of conductive vias 18 which extend through substrate 12. It is helpful to note that since FIG. 1 illustrates only a cross-sectional view of substrate 12, not all traces, vias, and pads of device 10 are represented. Electrical signals are routed from the substrate to semiconductor die 13 by a plurality of conductive wires 19, or by other known coupling methods such as tape-automated-bonding (TAB), which electrically coupled the die to conductive traces 14. External electrical access to semiconductor die 13 is established through a plurality of solder balls 21, each metallurgically bonded to a conductive pad 16. Typically, pads 16 and solder balls 21 will be arranged in an array configuration on the bottom of substrate 12, thus device 10 is referred to as a pad array or ball array device. Rather than using solder balls, conductive pins (not illustrated) may be coupled to pads 16 to establish a pin grid array device also in accordance with the present invention. Alternatively, pads 16 can be electrically bonded or coupled directly to an underlying substrate without use of balls or pins.

Substrate 12 is manufactured using conventional processes. The bulk material used for the substrate is preferably a glass, fabric-reinforced resin, such as an epoxy, polyimide, triazine, or phenolic resin. More specifically, a bismaleimide-triazine (BT) resin is preferred; however, other substrate materials are also suitable. For instance, various epoxy-glass composites, printed circuit board (PCB) materials, flexible circuits, or ceramic substrates may be used. Also, reinforcements other than glass can be used in a substrate, such as aramid and ceramic fibers. Likewise, particle reinforcements may be used instead of fibers. Conductive traces 14 and conductive pads 16 are typically formed on substrate 14 by laminating a conductive foil or by plating a conductive film to the substrate, wherein the conductive material is usually copper. Traces and pads are defined by patterning the foil using lithography techniques. Alternatively, traces and pads may be screen printed or otherwise deposited onto surfaces of the substrate. Both the conductive traces and pads are typically plated with gold to establish a non-oxidizable surfaces suitable for bonding. Thus, the traces and pads will typically include two layers, a laminated layer of copper and an overlying plated layer of gold or a combination of nickel and gold. However, for purposes of clarity the conductive traces, pads, and vias are illustrated as being of a single layer of material throughout the description of the present invention. Conductive vias 18 are typically formed in substrate 12 by drilling or punching holes through the substrate and subsequently plating the holes with copper, and sometimes also with nickel and gold, so that only sidewalls of the holes are conductive. Alternatively, holes may be molded into a substrate and later plated to formed conductive vias. In either case, the resulting vias are usually hollow.

In accordance with the present invention substrate 12 includes an opening 20 which extends completely through the substrate. Opening 20 is preferably punched or routed out of the substrate material after conductive traces 14 and pads 16 have been defined, although the opening can be created at any point in manufacturing substrate 12, and the opening need not be punched. For reasons related to the shape of most conventional semiconductor die, opening 20 is preferably square or rectangular. Positioned within opening 20 is a heat sink 22. Heat sink 22 includes a base portion 24, sidewalls 26, and flanges 28. Together the base portion and sidewalls of the heat sink form a cavity for receiving semiconductor die 13. The die is mounted to base portion 24 of the heat sink by a conventional die attach material 30, such as a silver-filled epoxy. Preferably, a top surface of die 13 is approximately planar with a top surface of substrate 12 so that the overall height of device 10 is kept as small as possible. However, the top surface of die 13 could instead by raised above or recessed below the top surface of substrate 12.

Heat sink 22 is configured so that flanges 28 rest on a top surface of substrate 12. If desired, the flanges may be adhesively attached to the substrate by an adhesive material 32 which may be either electrically conductive or non-conductive. An electrically conductive adhesive material may be useful in coupling the heat sink to ground potential if desired. For additional security, an adhesive material may also be used to bond sidewalls 26 of the heat sink to portions of the substrate exposed within opening 20. An adhesive material, however, is not required to secure the heat sink in opening 20. Heat sink 22 may be adequately secured within opening 20 by a molded package body 33 which encapsulates die 13, portions of heat sink 22 and portions of substrate 12. Also, dimensions of heat sink 22 and opening 20 may provide a tight enough fit that additional security is not necessary to hold the heat sink in place.

Heat sink 22 is also configured so that base portion 22 is thicker than flanges 28. This thickness relationship is beneficial for several reasons. One reason is that by keeping flanges 28 thin the profile or height of device 10 can also be kept small. Another reason for making flanges 28 thin is to reduce the possibility of electrically short-circuiting conductive wires 19 to the heat sink. As illustrated in FIG. 1, in coupling die 13 to conductive traces 14, conductive wires 19 span over flanges 28 of the heat sink, creating a potential for short-circuiting. The short-circuiting probability can be reduced by making the flanges as thin as possible, by increasing the loop height of wires 19, or alternatively by using an insulating material (not shown) to cover the flanges. Base portion 22, on the other hand, is preferably quite thick so that the heat sink extends below substrate 12 to establish a continuous thermal path to a typical user substrate 34. Also, the thickness of base portion 22 establishes the planarity between the top of die 13 and the top of substrate 12. To ensure a continuous thermal path, a thermally conductive bonding material 36, for instance solder or a thermally conductive epoxy, can be used between heat sink 22 and user substrate 34. If solder is used for bonding material 36, the heat sink can be bonded to user substrate 34 during the same solder reflow operation used to couple solder balls 21 to solder pads 35 on the user substrate.

Figure 2:
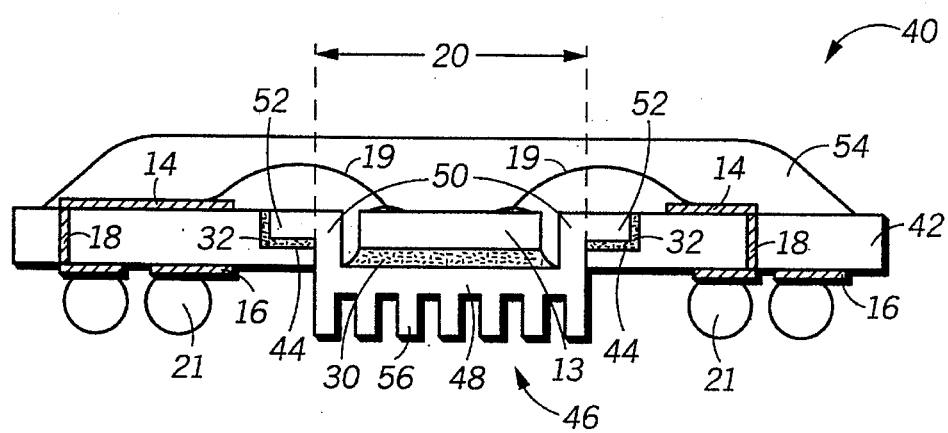

FIG. 2 is a cross-sectional view illustrating another semiconductor device 40 in accordance with the present invention. Since several of the elements of device 40 have already been described previously, like reference numerals are used to designate identical or corresponding elements in FIG. 2 and throughout the remaining figures of this description. Device 40 includes a circuitized substrate 42 which is different from the previously described circuitized substrate in that substrate 42 has a recess formed in a top surface which creates a ledge 44 surrounding opening 20. A heat sink 46, having a base portion 48, sidewalls 50, and flanges 52, is positioned in opening 20 such that flanges 52 rest upon ledge 44. If desired, the flanges can be secured to the ledge by adhesive material 32.

Ledge 44 can be created in substrate 42 using known substrate manufacturing techniques. For example, the top surface of the substrate can be routed or milled to an appropriate depth either before or after opening 20 is formed. While the creation of ledge 44 adds to the manufacturing cost of substrate 42, a benefit is a lower profile device. Device 40 can be made thinner than the previously described device 10 because the flanges of the heat sink are planar with the substrate. As a result, wire bond loop heights can be reduced, as can the thickness of a package body 54, illustrated in FIG. 2 as a glob-top package body. Another benefit of making the flanges planar with substrate 42 is the reduced chance of electrically short-circuiting conductive wires 19 to heat sink 46. The depth of the ledge with respect to the top surface of substrate 42 determines the proximity of flanges 52 to conductive wires 19. Therefore, the thickness of flanges 52 is less critical than if the flanges rest on the top surface of the substrate.

As FIG. 2 illustrates, base portion 48 of heat sink 46 is configured to include fins 56. Fins 56 are provided to increase the exposed surface area of the heat sink for improved thermal conductivity. The exposed surface area of a portion of a heat sink used in accordance with the present invention can be increased in ways other than using fins. Generally, a surface area can be increased by creating any depressions, projections, or other topography in the surface. This type of heat sink is particularly effective in cases in which fluid is flowed under the semiconductor device for cooling purposes.

Figure 3:
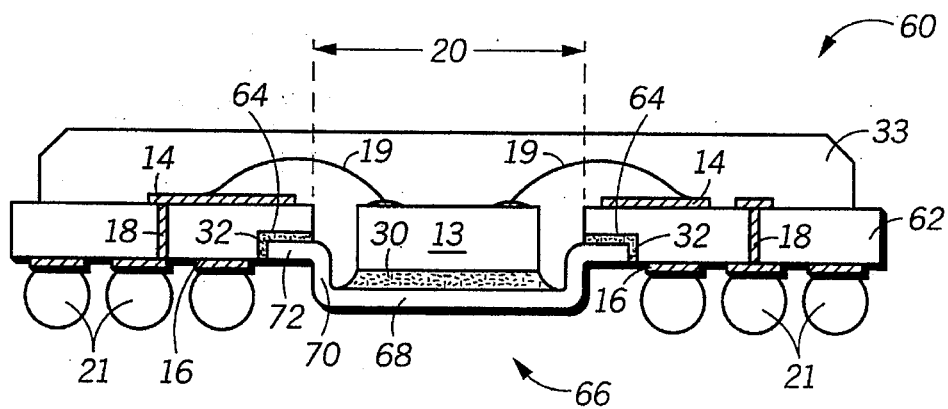

FIG. 3 illustrates another form of the invention in which a heat sink is not inserted into an opening in a substrate, but is instead attached to the substrate such that the heat sink at least partially closes an opening in a substrate. A semiconductor device 60 illustrated in a cross-sectional view in FIG. 3 includes a circuitized substrate 62 having a ledge 64. Ledge 64 is formed, for example, by routing or milling a bottom surface of the substrate, as opposed to forming a ledge from a top surface of the substrate as discussed in reference to FIG. 2. A heat sink 66, having a base portion 68, sidewalls 70, and flanges 72, is attached to substrate 62 such that opening 20 is covered on the bottom of the substrate. Heat sink 66 is secured by attaching flanges 72 to ledge 64 with adhesive material 32. Using the heat sink and substrate configurations illustrated in FIG. 3, adhesive material 32 is probably necessary since substrate 62 provides no mechanical support for heat sink 66. It is important to note however, that ledge 64 is not necessary. Rather than using a ledge, flanges 72 can be attached directly to the bottom surface of substrate 62 while still partially covering opening 20.

An advantage in attaching the heat sink to cover opening 20, as illustrated in FIG. 3, rather than inserting the heat sink into the opening, as illustrated in FIGS. 1 and 2, is that the potential for electrically short-circuiting conductive wires 19 to the heat sink is virtually eliminated. As device 60 demonstrates, wires 19 are separated from flanges of the heat sink by ledge 64. Since the bulk material of substrate 62 is an insulator, deformation of wires 19 in a vertical direction such that the wires contact the bulk material of substrate 62 will not cause short-circuiting.

Figure 4:
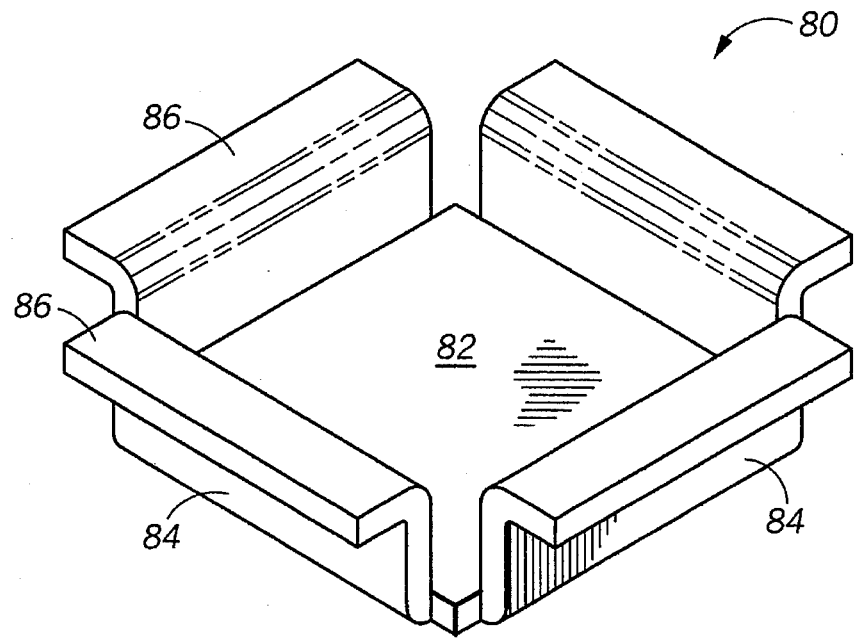
FIGS. 4–6 each illustrate, in perspective, a heat sink configuration suitable for use with the present invention.
Figure 5:
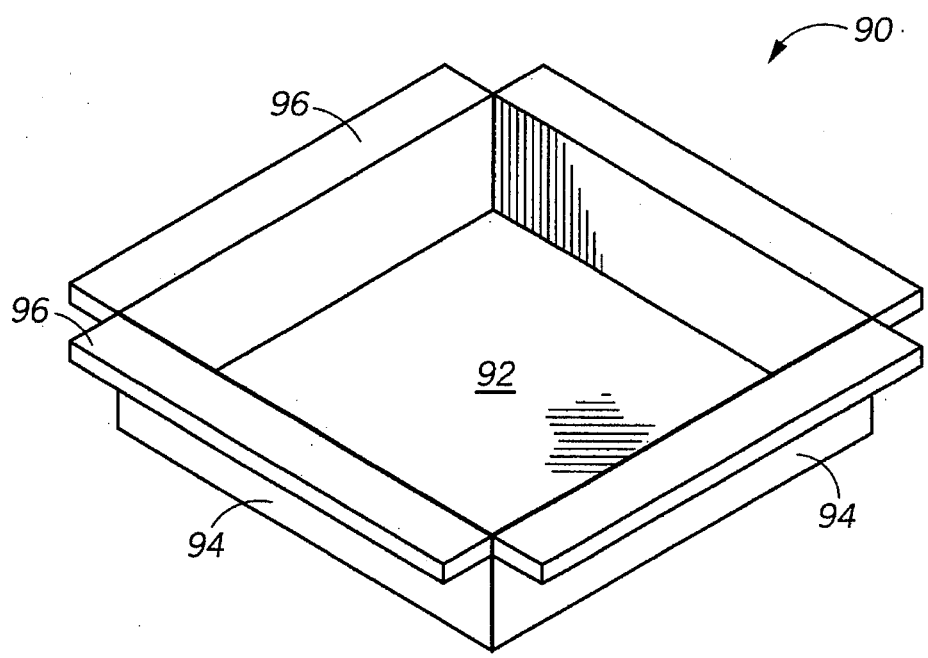
Figure 6:
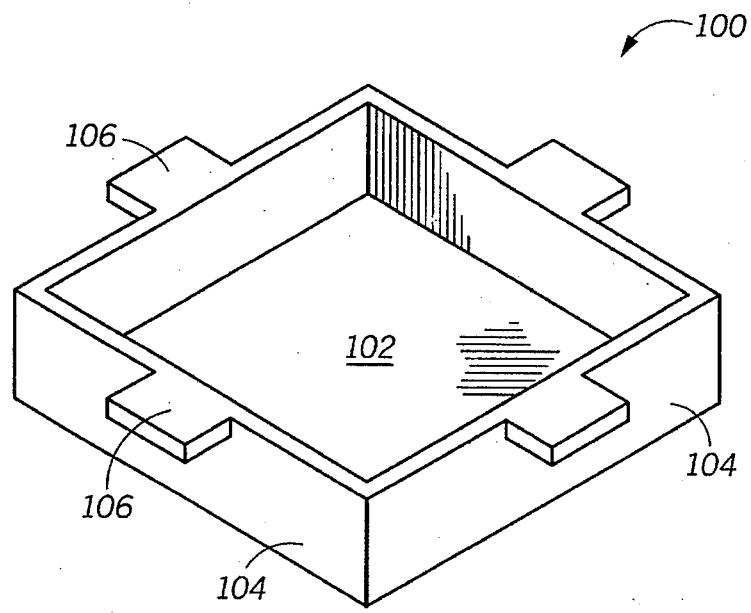

A heat sink used in accordance with the present invention need not have the exact configurations illustrated in FIGS. 1–3. Various configurations are suitable for use with the present invention, including the configurations illustrated in FIGS. 4–6 and others. FIGS. 4–6 illustrate in perspective views heats sinks 80, 90, and 100, respectively. Common features of each heat sink include a base portion, sidewalls, and flanges. In particular, heat sinks 80, 90, and 100 have base portions 82, 92, and 102, respectively, sidewalls 84, 94, and 104, respectively, and flanges 86, 96, and 106, respectively. As apparent from FIGS. 4–6, sidewalls of a heat sink need not be contiguous with one another, nor do flanges have to extend entirely along a sidewall. Furthermore, edges of heat sinks which join the flanges, sidewalls, and base portions may be sharp or include a degree of curvature.

Heat sinks used in accordance with the present invention may be manufactured using known techniques, including stamping, coining, etching, welding, and combinations of these techniques. In a preferred form, the heat sink is made of copper, a copper alloy or other material having a high thermal conductivity. Since one advantage of present invention is that a semiconductor device can have good thermal dissipation while maintaining a low profile, it is also preferred that heat sinks used in accordance with the invention be made from a relatively thin material. However, as noted earlier, not all portions of a heat sink need be the same thickness. One suitable material is copper foil which is similar to, but slightly thicker than, that used to form conductive traces and pads on a circuitized substrate. In a preferred embodiment of the present invention, a circuitized substrate is approximately 10 to 20 mils (0.25 to 0.51 mm) thick and solder balls each have a diameter of 25 mils (0.64 mm). Accordingly, a heat sink in accordance with the present invention preferably has a general material thickness of between 2 and 20 mils (0.05 to 0.50 mm).

Other dimensions of a heat sink used in a semiconductor device in accordance with the present invention can vary a great deal. Many dimensions will be dictated by the size of a semiconductor die mounted in the heat sink and the dimensions of a circuitized substrate to which the heat sink is attached. For instance, the area of a base portion of a heat sink should be slightly larger than the area of the semiconductor die and should be approximately equal to the area of an opening in the circuitized substrate. Also, the sidewalls of a heat sink should have a height at least as great as the thickness of the substrate. Dimensions and configurations of heat sink flanges are less restricted. Flanges of a heat sink may be wide enough to barely rest on a substrate or may span close to the entire distance between an opening in the substrate and any surrounding conductive traces. Also, the thickness of a base portion of a heat sink is more or less unrestricted. In a preferred embodiment, the base portion thickness should be such that the top surface or active surface of the semiconductor die is planar with the circuitized substrate to achieve the smallest possible device profile. The die can also be made planar with the substrate by adjusting the height of the sidewalls of the heat sink. The base portion also preferably extends below circuitized substrate to facilitate thermal coupling to a user's substrate. However, many benefits of the present invention are achieved if the base portion is planar with the circuitized substrate.

Figure 7:
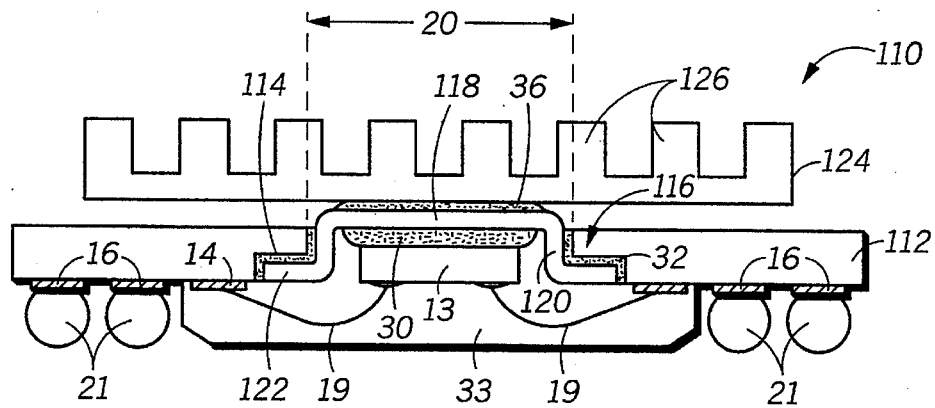
FIGS. 7–8 each illustrate, in cross-section, an "inverted" semiconductor device also in accordance with the present invention.
Figure 8:
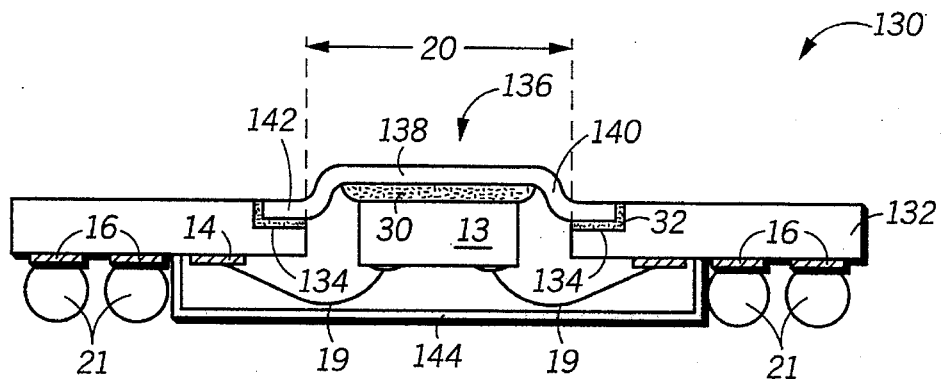

In other forms of the present invention, a semiconductor device has an inverted or die-down configuration, as represented in FIGS. 7 and 8. FIG. 7 is a cross-sectional view illustrating a semiconductor device 110. Device 110 and a semiconductor device 130 illustrated in FIG. 8 include many of the same elements previously described and illustrated; therefore, the same reference numerals are used to designate identical or corresponding elements. In device 110 of FIG. 7, a circuitized substrate 112 includes opening 20 surrounded by a ledge 114. Ledge 114 is formed in a bottom surface of the substrate. Situated within opening 20 is a heat sink 116 having a base portion 118, sidewalls 120, and flanges 122. As in FIG. 2, flanges of the heat sink are attached to the ledges of the substrate by adhesive material 32. However, unlike devices described previously, heat sink 116 is attached to the substrate in an inverted manner such that base portion 118 is exposed on a top surface of substrate 112. With the base portion exposed on the top of the substrate, a second, larger heat sink 124 can be thermally coupled to the device for added heat dissipation. Heat sink 124 is attached to heat sink 116 by thermally conductive bonding material 36, such as solder or a thermally conductive epoxy. If desired, heat sink 124 can have a topography or contoured surface to maximize the exposed surface area by the inclusion of, for example, fins 126.

With heat sink 116 inverted, semiconductor die 13 is face-down as illustrated in FIG. 7. Therefore, electrical interconnection between the die and circuitized substrate 112 is accomplished on the bottom surface of the substrate by conductive traces 14, conductive pads 16, and conductive wires 19. Likewise, package body 33 is formed on the bottom surface of the substrate amidst solder balls 21. The presence of package body on the bottom surface of substrate 112 somewhat restricts the location of solder balls 21 and may increase the footprint of the device; however, in some instances the added heat dissipation capabilities of a second heat sink are needed.

A similar inverted semiconductor device 130 is illustrated in a cross-sectional view in FIG. 8. Device 130 includes a circuitized substrate 132 in which opening 20 is surrounded by a ledge 134. The ledge is formed in a top surface of substrate 132. Situated within opening 20 is a heat sink 136 having a base portion 138, sidewalls 140, and flanges 142. It is worth noting again that ledge 134 is not necessary. Rather than using a ledge, flanges 142 can be attached directly to the top surface of substrate 132 while still covering opening 20. Unlike the device of FIG. 7, the heat sink of device 130 is not inserted into opening 20 but instead is attached to substrate 132 so that the opening is at least partially closed, specifically so that the top of the opening is covered. Thus, device 130 is similar to the device illustrated in FIG. 3 but is inverted so that most or all circuitry and electrically interconnections are on the bottom of substrate 132. An advantage of including circuitry only on the bottom of substrate 132 is a lower substrate cost, due to the fact that conductive vias are not required and only one layer of metallization is used. FIG. 8 also demonstrates that encapsulation of a semiconductor die need not be accomplished with a molded or resin package body. Device 130 includes a lid 144 which encapsulates semiconductor die 13, conductive wires 19, and portions of conductive traces 14. Together, lid 144 and heat sink 136 fully enclose opening 20 of the substrate. Lid 144 can be made from a conventional semiconductor packaging material, including metals, plastics, and ceramics.

The foregoing description and illustrations contained herein demonstrate many of the advantages associated with the present invention. In particular, it has been revealed that the configuration of a heat sink used in accordance with the present invention enables the heat sink to be incorporated as part of a conventional substrate rather than an external component of a semiconductor device. Thus, the size of a device in accordance with the present invention is comparable to conventional pad array devices yet has improved thermal dissipation. The improvement in thermal dissipation is achieved because the entire base portion of the heat sink serves as the thermal dissipation area, as opposed to the cross-sectional area of thermal vias used in conventional devices. In addition, a direct thermal path to a user substrate can be easily established by extending a base portion of the heat sink below a circuitized substrate. With respect to device size, the die receiving cavity of the heat sink results in a reduced device height or profile since a semiconductor die is mounted below the surface of the substrate. Yet another advantage of the present invention is that a heat sink of a device acts as an excellent barrier to moisture ingress into the area near the semiconductor die.

A further advantage of the present invention is the many ways in which the heat sink can be attached to a circuitized substrate. For instance, the heat sink can be inserted in an opening of the substrate such that the flanges rest on a surface of the substrate and secure the heat sink in position. Alternatively, flanges of the heat sink may be attached to a surface of the substrate such that the heat sink encloses one side of the opening in the substrate, rather than being inserted into the opening. Also, the heat sink can be attached to either a top or a bottom surface of the substrate. Furthermore, recesses may be formed in a substrate surface such that flanges of the heat sink rest on the ledges. In other variations, the heat sink may be attached to substrate in an inverted manner resulting in a "die-down" device configuration.

Thus it is apparent that there has been provided, in accordance with the invention, a pad array semiconductor device having a heat sink with a die receiving cavity, and method for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, conductive pins may be used in place of solder balls as external terminals of the device. A ledge or ledges, if used in a circuitized substrate, need not completely surround an opening in the substrate. Also, a heat sink used in a device in accordance with the present invention need not have the specific configurations illustrated herein and need not have the dimensional relationships described. For example, a base portion and/or sidewalls of a heat sink need not extend below a bottom surface of the substrate. Furthermore, it is not necessary for a semiconductor die to be planar with a substrate surface. A die surface can instead be above or below a substrate surface. In addition, the invention is not limited to those specific materials described. For instance, encapsulation of a semiconductor device may include any known encapsulation method such as resin molding compounds, glob-top resins, metal lids, ceramic lids, and the like. Likewise, a semiconductor die can be coupled to a circuitized substrate materials using any known coupling methods. Furthermore, materials other than those listed can be used to make a heat sink. Also, any existing circuitized substrate can be used in accordance with the present invention. It is also important to note that the present invention is applicable to multichip module devices in addition to embodiments having a single semiconductor die. In addition, it is possible for a heat sink used in accordance with the present invention to serve as a voltage reference plane, for instance a ground potential plane, in addition to providing thermal dissipation. Using the heat sink as a voltage plane can easily be achieved by electrically coupling the heat sink to one or more appropriate conductive traces of the circuitized substrate. Therefore, it is intended that this invention encompass all such variations and modifications as fall within the scope of the appended claims.

I claim:

1. A semiconductor device comprising:
   a circuitized substrate having a major surface, a plurality of conductive traces, an opening which extends completely through the substrate, and a recess formed in the major surface which creates a ledge adjacent the opening;
   a heat sink inserted in the opening of the substrate, the heat sink comprising, a base portion having a first thickness, sidewalls, a die receiving cavity, and flanges extending outward from the sidewalls, the flanges of the heat sink having a second thickness less than the first thickness and being attached to the ledge of the substrate for mechanically supporting the heat sink within the opening, wherein the sidewalls are adjacent the substrate within the opening and wherein the heat sink at least partially closes the opening of the substrate;
   a semiconductor die positioned in the die receiving cavity of the heat sink;
   means for electrically coupling the semiconductor die to the plurality of conductive traces;
   means for encapsulating the semiconductor die and the opening of the substrate; and
   a plurality of terminals attached to the substrate and electrically coupled to the plurality of conductive traces to provide external electrical access to the die.

2. The semiconductor device of claim 1 wherein the substrate has an opposing surface opposite the major surface, and wherein the semiconductor die has an active surface which is approximately planar with either the major surface or the opposing surface of the substrate.

3. The semiconductor device of claim 1 wherein the plurality of terminals comprises a plurality of solder balls.

4. The semiconductor device of claim 1 wherein the means for encapsulating comprises a means selected from a group consisting of: a lid and a resin.

5. The semiconductor device of claim 1 wherein the substrate has an opposing surface opposite the major surface, and wherein the flanges are adjacent to the major surface of the substrate and the terminals are attached to the opposing surface of the substrate.

6. The semiconductor device of claim 5 wherein the base portion of the heat sink extends below the opposing surface of the substrate.

7. The semiconductor device of claim 1 wherein the substrate has an opposing surface opposite the major surface, and wherein the flanges are adjacent the major surface of the substrate and the terminals are attached to the major surface of the substrate.

8. The semiconductor device of claim 7 wherein the base portion of the heat sink is exposed on the opposing surface of the substrate.

9. The semiconductor device of claim 7 wherein the base portion of the heat sink extends above the opposing surface of the substrate.

10. A semiconductor device comprising:
    a circuitized substrate having a top surface, a bottom surface, a plurality of conductive traces formed on the top surface, an opening which extends completely through the substrate, and a recess in the top surface adjacent the opening;
    a heat sink comprising a die receiving cavity, a base portion, sidewalls, and flanges extending from the sidewalls, the heat sink being inserted into the opening of the substrate such that the opening is at least partially enclosed, such that the sidewalls are adjacent the substrate within the opening, and such that the flanges fit in the recess and are planar with the top surface of the substrate and mechanically support the heat sink within the opening;
    a semiconductor die positioned in the die receiving cavity of the heat sink and attached to the base portion thereof;
    means for electrically coupling the semiconductor die to the plurality of conductive traces;
    means for encapsulating the semiconductor die and the opening of the substrate; and
    terminals attached to the bottom surface of the substrate and electrically coupled to the plurality of conductive traces for electrically coupling the device to a user substrate.

11. The semiconductor device of claim 10 wherein the base portion of the heat sink is exposed on the bottom surface of the substrate.

12. A semiconductor device comprising:
    a circuitized substrate having a top surface, a bottom surface, a plurality of conductive traces formed on the top surface, an opening which extends completely through the substrate, and a recess in the bottom surface adjacent the opening;
    a heat sink comprising a die receiving cavity, a base portion, sidewalls, and flanges extending from the sidewalls, the heat sink being inserted into the opening of the substrate such that the opening is at least partially enclosed, such that the sidewalls are adjacent the substrate within the opening, and such that the flanges fit in the recess and are planar with the bottom surface of the substrate and mechanically support the heat sink within the opening;
    a semiconductor die positioned in the die receiving cavity of the heat sink and attached to the base portion thereof;
    means for electrically coupling the semiconductor die to the plurality of conductive traces;
    means for encapsulating the semiconductor die and the opening of the substrate; and
    terminals attached to the bottom surface of the substrate and electrically coupled to the plurality of conductive traces for electrically coupling the device to a user substrate.

13. The semiconductor device of claim 12 wherein the base portion of the heat sink is exposed on the top surface of the substrate.

* * * * *